United States Patent

Song

(10) Patent No.: US 9,136,016 B2
(45) Date of Patent: Sep. 15, 2015

(54) SEMICONDUCTOR MEMORY APPARATUS

(71) Applicant: SK hynix Inc., Incheon-si, Gyeonggi-do (KR)

(72) Inventor: Choung Ki Song, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/210,654

(22) Filed: Mar. 14, 2014

(65) Prior Publication Data

US 2015/0155013 A1    Jun. 4, 2015

(30) Foreign Application Priority Data

Nov. 29, 2013  (KR) ........................ 10-2013-0147081

(51) Int. Cl.
| | |
|---|---|
| G11C 8/00 | (2006.01) |
| G11C 8/06 | (2006.01) |
| G11C 7/10 | (2006.01) |
| G11C 29/08 | (2006.01) |
| G11C 29/18 | (2006.01) |
| G11C 7/08 | (2006.01) |
| G11C 29/02 | (2006.01) |
| G11C 29/12 | (2006.01) |
| G11C 11/408 | (2006.01) |

(52) U.S. Cl.
CPC ............ *G11C 29/022* (2013.01); *G11C 29/023* (2013.01); *G11C 29/028* (2013.01); *G11C 29/1201* (2013.01); *G11C 7/106* (2013.01); *G11C 7/109* (2013.01); *G11C 8/06* (2013.01); *G11C 11/408* (2013.01)

(58) Field of Classification Search
CPC ...... G11C 8/06; G11C 77/109; G11C 11/408; G11C 7/106
USPC ................................ 365/189.05, 201, 230.08
See application file for complete search history.

(56) References Cited

U.S. PATENT DOCUMENTS

| | | | |
|---|---|---|---|
| 6,097,644 A * | 8/2000 | Shirley | ........................ 365/200 |
| 6,910,157 B1 * | 6/2005 | Park et al. | ....................... 714/36 |
| 7,742,349 B2 | 6/2010 | Jeong et al. | |
| 8,199,588 B2 | 6/2012 | Heo | |
| 2009/0265591 A1 * | 10/2009 | Okukawa et al. | ............. 714/718 |

* cited by examiner

*Primary Examiner* — Ly D Pham
(74) *Attorney, Agent, or Firm* — William Park & Associates Ltd.

(57) ABSTRACT

A semiconductor memory apparatus includes a latch section including a plurality of latches configured to store test data, a control signal generation part configured to generate a mode selection signal in response to a latch address signal and a first mode signal, and an output circuit configured to operate in accordance with a training enable signal, and generate at least a subset of test data output by each of the plurality of latches in response to a latch selection signal, the mode selection signal, and a second mode signal.

19 Claims, 15 Drawing Sheets

FIG.4

| | UI0 | UI1 | UI2 | UI3 | UI4 | UI5 | UI6 | UI7 |
|---|---|---|---|---|---|---|---|---|
| DQ[0] | MPR0[7] | MPR0[6] | MPR0[5] | MPR0[4] | MPR0[3] | MPR0[2] | MPR0[1] | MPR0[0] |
| DQ[1] | MPR0[7] | MPR0[6] | MPR0[5] | MPR0[4] | MPR0[3] | MPR0[2] | MPR0[1] | MPR0[0] |
| DQ[2] | MPR0[7] | MPR0[6] | MPR0[5] | MPR0[4] | MPR0[3] | MPR0[2] | MPR0[1] | MPR0[0] |
| DQ[3] | MPR0[7] | MPR0[6] | MPR0[5] | MPR0[4] | MPR0[3] | MPR0[2] | MPR0[1] | MPR0[0] |
| DQ[4] | MPR0[7] | MPR0[6] | MPR0[5] | MPR0[4] | MPR0[3] | MPR0[2] | MPR0[1] | MPR0[0] |
| DQ[5] | MPR0[7] | MPR0[6] | MPR0[5] | MPR0[4] | MPR0[3] | MPR0[2] | MPR0[1] | MPR0[0] |
| DQ[6] | MPR0[7] | MPR0[6] | MPR0[5] | MPR0[4] | MPR0[3] | MPR0[2] | MPR0[1] | MPR0[0] |
| DQ[7] | MPR0[7] | MPR0[6] | MPR0[5] | MPR0[4] | MPR0[3] | MPR0[2] | MPR0[1] | MPR0[0] |

FIG.5

| | UI0 | UI1 | UI2 | UI3 | UI4 | UI5 | UI6 | UI7 |
|---|---|---|---|---|---|---|---|---|
| DQ[0] | MPR0[7] | MPR0[7] | MPR0[7] | MPR0[7] | MPR0[7] | MPR0[7] | MPR0[7] | MPR0[7] |
| DQ[1] | MPR0[6] | MPR0[6] | MPR0[6] | MPR0[6] | MPR0[6] | MPR0[6] | MPR0[6] | MPR0[6] |
| DQ[2] | MPR0[5] | MPR0[5] | MPR0[5] | MPR0[5] | MPR0[5] | MPR0[5] | MPR0[5] | MPR0[5] |
| DQ[3] | MPR0[4] | MPR0[4] | MPR0[4] | MPR0[4] | MPR0[4] | MPR0[4] | MPR0[4] | MPR0[4] |
| DQ[4] | MPR0[3] | MPR0[3] | MPR0[3] | MPR0[3] | MPR0[3] | MPR0[3] | MPR0[3] | MPR0[3] |
| DQ[5] | MPR0[2] | MPR0[2] | MPR0[2] | MPR0[2] | MPR0[2] | MPR0[2] | MPR0[2] | MPR0[2] |
| DQ[6] | MPR0[1] | MPR0[1] | MPR0[1] | MPR0[1] | MPR0[1] | MPR0[1] | MPR0[1] | MPR0[1] |
| DQ[7] | MPR0[0] | MPR0[0] | MPR0[0] | MPR0[0] | MPR0[0] | MPR0[0] | MPR0[0] | MPR0[0] |

FIG.6

|  | UI0 | UI1 | UI2 | UI3 | UI4 | UI5 | UI6 | UI7 |
|---|---|---|---|---|---|---|---|---|
| DQ[0] | MPR0[7] | MPR0[6] | MPR0[5] | MPR0[4] | MPR0[3] | MPR0[2] | MPR0[1] | MPR0[0] |
| DQ[1] | MPR1[7] | MPR1[6] | MPR1[5] | MPR1[4] | MPR1[3] | MPR1[2] | MPR1[1] | MPR1[0] |
| DQ[2] | MPR2[7] | MPR2[6] | MPR2[5] | MPR2[4] | MPR2[3] | MPR2[2] | MPR2[1] | MPR2[0] |
| DQ[3] | MPR3[7] | MPR3[6] | MPR3[5] | MPR3[4] | MPR3[3] | MPR3[2] | MPR3[1] | MPR3[0] |
| DQ[4] | MPR0[7] | MPR0[6] | MPR0[5] | MPR0[4] | MPR0[3] | MPR0[2] | MPR0[1] | MPR0[0] |
| DQ[5] | MPR1[7] | MPR1[6] | MPR1[5] | MPR1[4] | MPR1[3] | MPR1[2] | MPR1[1] | MPR1[0] |
| DQ[6] | MPR2[7] | MPR2[6] | MPR2[5] | MPR2[4] | MPR2[3] | MPR2[2] | MPR2[1] | MPR2[0] |
| DQ[7] | MPR3[7] | MPR3[6] | MPR3[5] | MPR3[4] | MPR3[3] | MPR3[2] | MPR3[1] | MPR3[0] |

FIG.7

|  | BA[1:0]=00 | BA[1:0]=01 | BA[1:0]=10 | BA[1:0]=11 |
|---|---|---|---|---|
| DQ[0] | MPR0[7:0] | MPR1[7:0] | MPR2[7:0] | MPR3[7:0] |
| DQ[1] | MPR1[7:0] | MPR2[7:0] | MPR3[7:0] | MPR0[7:0] |
| DQ[2] | MPR2[7:0] | MPR3[7:0] | MPR0[7:0] | MPR1[7:0] |
| DQ[3] | MPR3[7:0] | MPR0[7:0] | MPR1[7:0] | MPR2[7:0] |
| DQ[4] | MPR0[7:0] | MPR1[7:0] | MPR2[7:0] | MPR3[7:0] |
| DQ[5] | MPR1[7:0] | MPR2[7:0] | MPR3[7:0] | MPR0[7:0] |
| DQ[6] | MPR2[7:0] | MPR3[7:0] | MPR0[7:0] | MPR1[7:0] |
| DQ[7] | MPR3[7:0] | MPR0[7:0] | MPR1[7:0] | MPR2[7:0] |

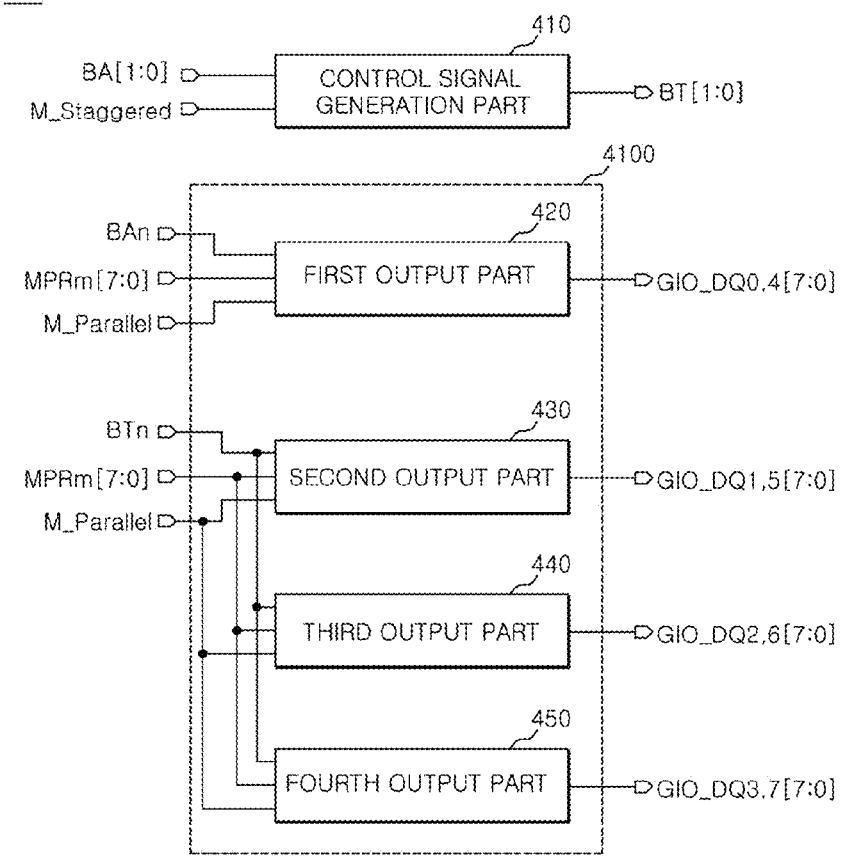

SEMICONDUCTOR MEMORY APPARATUS

CROSS-REFERENCE TO RELATED APPLICATION

The present application claims priority under 35 U.S.C. §119(a) to Korean application number 10-2013-0147081, filed on Nov. 29, 2013, in the Korean Intellectual Property Office, which is incorporated herein by reference in its entirety as set forth in full.

TECHNICAL FIELD

Various embodiments generally relate to an integrated circuit apparatus, and more particularly, to a semiconductor memory apparatus.

BACKGROUND

A semiconductor memory apparatus typically includes a core area and a peripheral area for performing data input/output operations. When the semiconductor memory apparatus is placed in normal operation mode, the semiconductor memory apparatus stores data received as input in response to a write command and retrieves data stored at the semiconductor memory apparatus for output in response to a read command.

In some cases, a semiconductor memory apparatus may be configured to be placed in a test operation mode. When the semiconductor memory apparatus is placed in test operation mode, the semiconductor apparatus often performs test operations associated with write operations read operations.

SUMMARY

In an embodiment, a semiconductor memory apparatus may include a latch section including a plurality of latches configured to store test data; a control signal generation part configured to generate a data output mode selection signal in response to a latch address signal and a first data output mode signal; and an output circuit configured to operate in accordance with a training enable signal and generate at least a subset of test data output by each of the plurality of latches in response to a latch selection signal, the data output mode selection signal, and a second data output mode signal.

In an embodiment, a semiconductor memory apparatus may include a latch section including a plurality of latches configured to store test data, a control signal generation part configured to select output test data of one latch from among the plurality of latches in response to a latch selection signal and to output a common mode signal, and an output circuit configured to output at least a subset of the test data received from each of the plurality of latches in response to the latch selection signal, the output data from each of the plurality of latches, a first data output mode signal, and a second data output mode signal.

BRIEF DESCRIPTION OF THE DRAWINGS

FIG. 4 to FIG. 7 are diagrams for explaining data output forms according to output modes of the training unit illustrated in FIG. 1;

FIG. 8 is a diagram of an embodiment of an output control section for a training unit applied to a semiconductor apparatus;

FIG. 9 is a diagram for explaining the generation concept of a data output mode selection signal for an embodiment of an output control section;

DETAILED DESCRIPTION

Various embodiments of a semiconductor memory apparatus will be described in detail with reference to the accompanying drawings.

Figure 1:
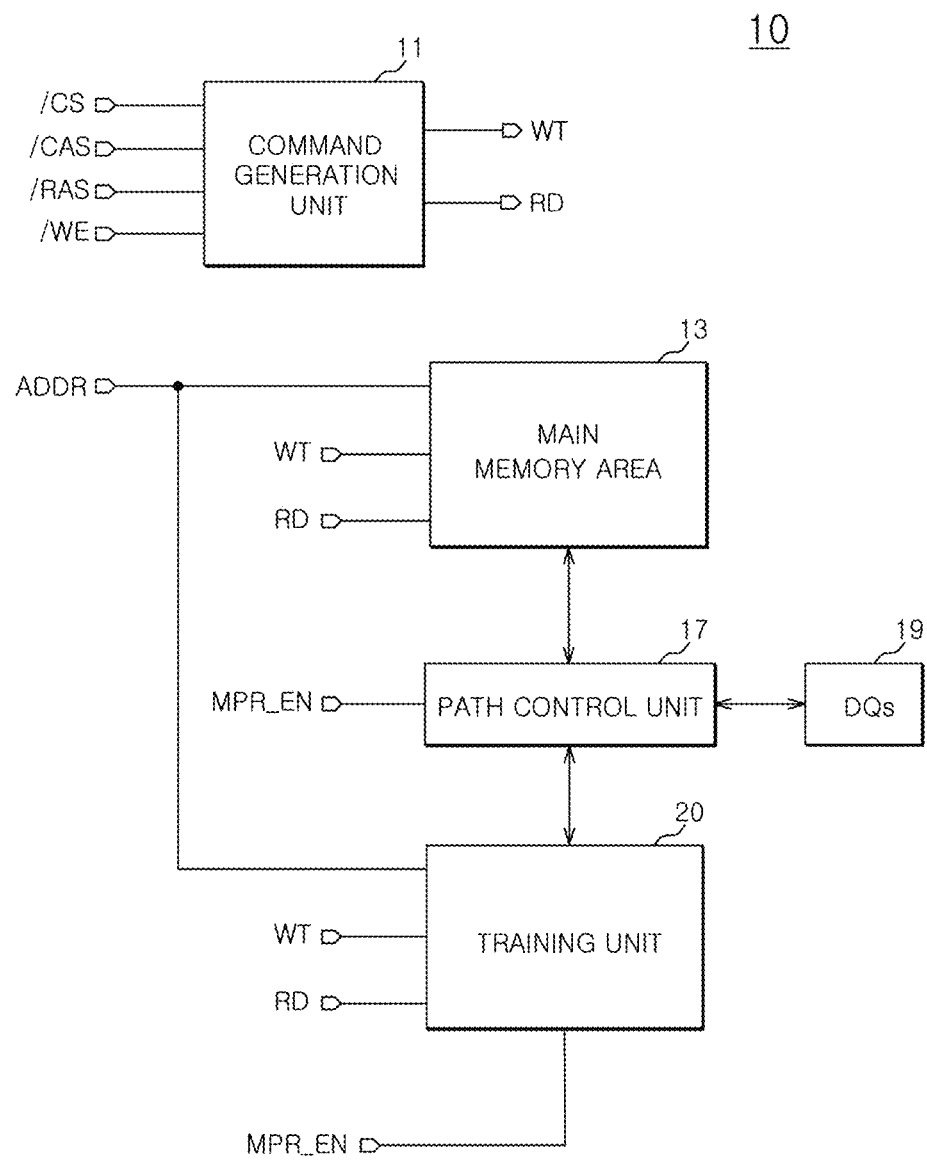
FIG. 1 is a configuration diagram of a semiconductor memory apparatus including an embodiment of a training unit.

Referring to FIG. 1, a block diagram representation of an example of a semiconductor memory apparatus 10 including an embodiment of a training unit 20 is shown. In an embodiment, the semiconductor memory apparatus 10 may be placed in a normal operation mode or in a testing operation mode. The semiconductor memory apparatus 10 may include other operation modes in addition to the normal operation mode and the testing operation mode.

The semiconductor memory apparatus 10 may include a command generation unit 11, a main memory area 13, a training unit 20, a path control unit 17, and an input/output pad (DQs) 19. The semiconductor memory apparatus 10 is placed in normal operation mode in response to a disabled training enable signal MPR_EN and in testing operation mode in response to an enabled training enable signal MPR_EN.

The command generation unit 11 generates a write command WT and a read command RD in response to a chip select signal /CS, a column strobe signal /CAS, a row strobe signal /RAS, and a write enable signal /WE.

When the semiconductor memory apparatus 10 is placed in normal operation mode, the path control unit 17 is configured to electrically couple the main memory area 13 and the input/output pad 19 in response to a disabled training enable signal MPR_EN. The main memory area 13 stores data received via the input/output pad 19 in response to a write command WT and an address signal ADDR and outputs data to the input/output pad 19 in response to a read command RD and the address signal ADDR.

When the semiconductor memory apparatus 10 is placed in testing operation mode, the path control unit 17 is configured to electrically couple the training unit 20 and the input/output pad 19 in response to an enabled training enable signal MPR_EN. The training unit 20 stores test data received via the input/output pad 19 in response to the write command WT and the address signal ADDR, and outputs test data to the input/output pad 19 in response to the read command RD and the address signal ADDR.

Figure 2:
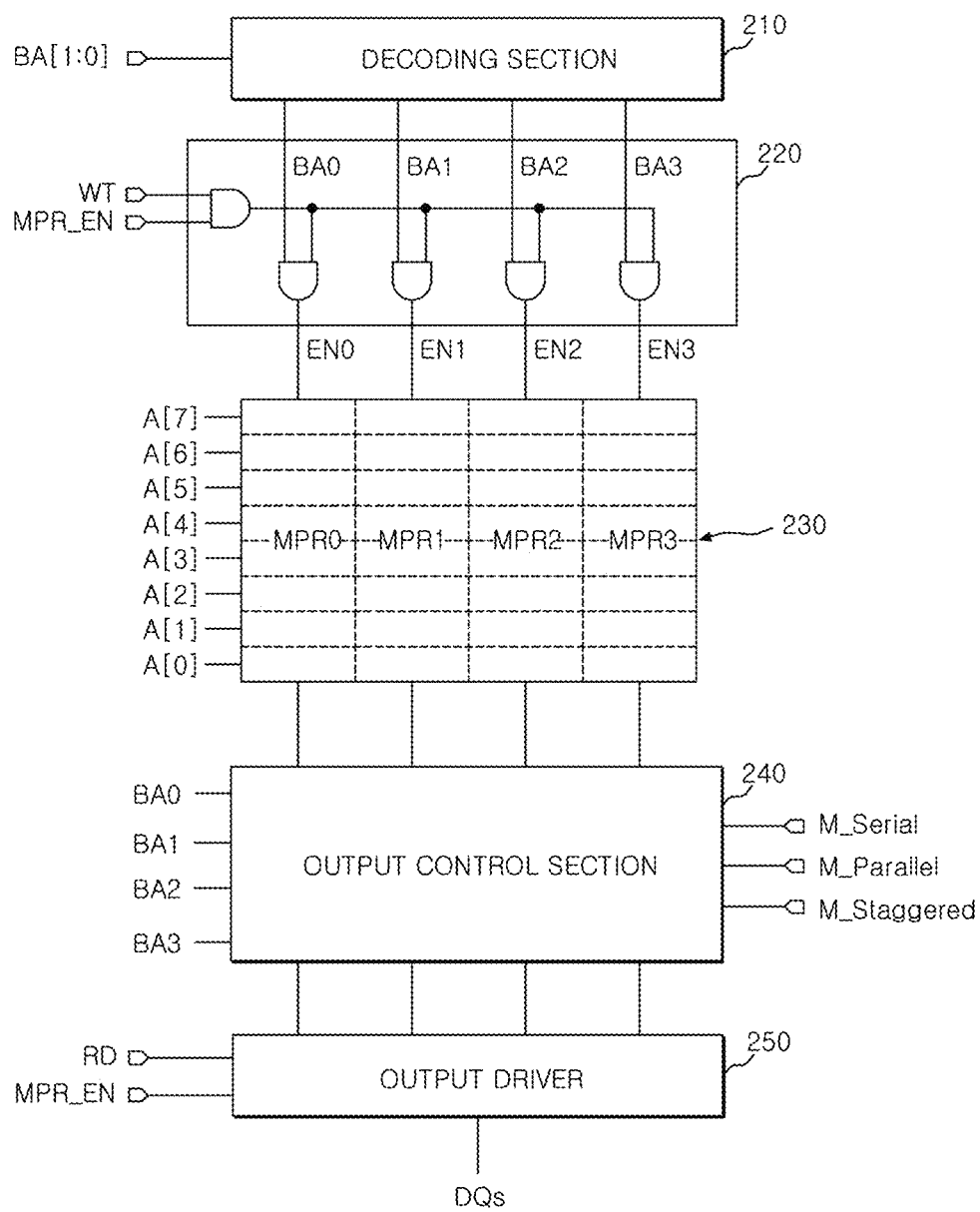
FIG. 2 is a configuration diagram of an embodiment of the training unit illustrated in FIG. 1.

Referring to FIG. 2, a diagram of an embodiment of a training unit 20 is shown. The training unit 20 may include a decoding section 210, a latch driving control section 220, a latch section 230 as a storage section, an output control section 240, and an output driver 250.

The decoding section 210 receives latch address signals BA[1:0] as an input and responsively generates latch selection signals BA0, BA1, BA2, BA3. The latch driving control section 220 receives the latch selection signals BA0, BA1, BA2, BA3, a write command WT and the training enable signal MPR_EN as inputs. A training write signal WR_T is generated in response to the write command WT and an enabled training enable signal MPR_EN. The latch driving control section 220 responsively generates latch enable signals EN0, EN1, EN2, EN3.

The latch section 230 receives the latch enable signals EN0, EN1, EN2, EN3 as inputs. The latch section 230 includes a plurality of latches MPR0, MPR1, MPR2, MPR3. Specific latches are selected by the latch enable signals EN0, EN1, EN2, EN3. Test data A[0:7] is provided to the latch section 230. Each of the plurality of latches MPR0, MPR1, MPR2, MPR3 has a storage area corresponding to the number of bits of the test data A[0:7]. The received test data A[0:7] is stored in the latch associated with the received latch enable signals EN0, EN1, EN2, EN3 in the latch section 230.

The output control section 240 receives the latch selection signals BA0, BA1, BA2, BA3 as inputs. The output control section 240 retrieves the test data A[0:7] stored in the latch MPR0, MPR1, MPR2, MPR3 associated with the received latch selection signals BA0, BA1, BA2, BA3 from the latch section 230. The output control section 240 receives a serial output mode control signal M_Serial, a parallel output mode control signal M_Parallel and staggered output mode control signal M_Staggered as inputs and responsively generates the test data A[0:7] in accordance with the received output mode signals M_Serial, M_Parallel, and M_Staggered.

The output driver 250 receives the test data A[0:7] from the output control section 240 and amplifies the received test data A[0:7]. The output drive 250 receives a read command and the enabled training enable signal MPR_EN as inputs and responsively outputs the amplified test data A[0:7] to the input/output pad 19 DQs.

Figure 3:
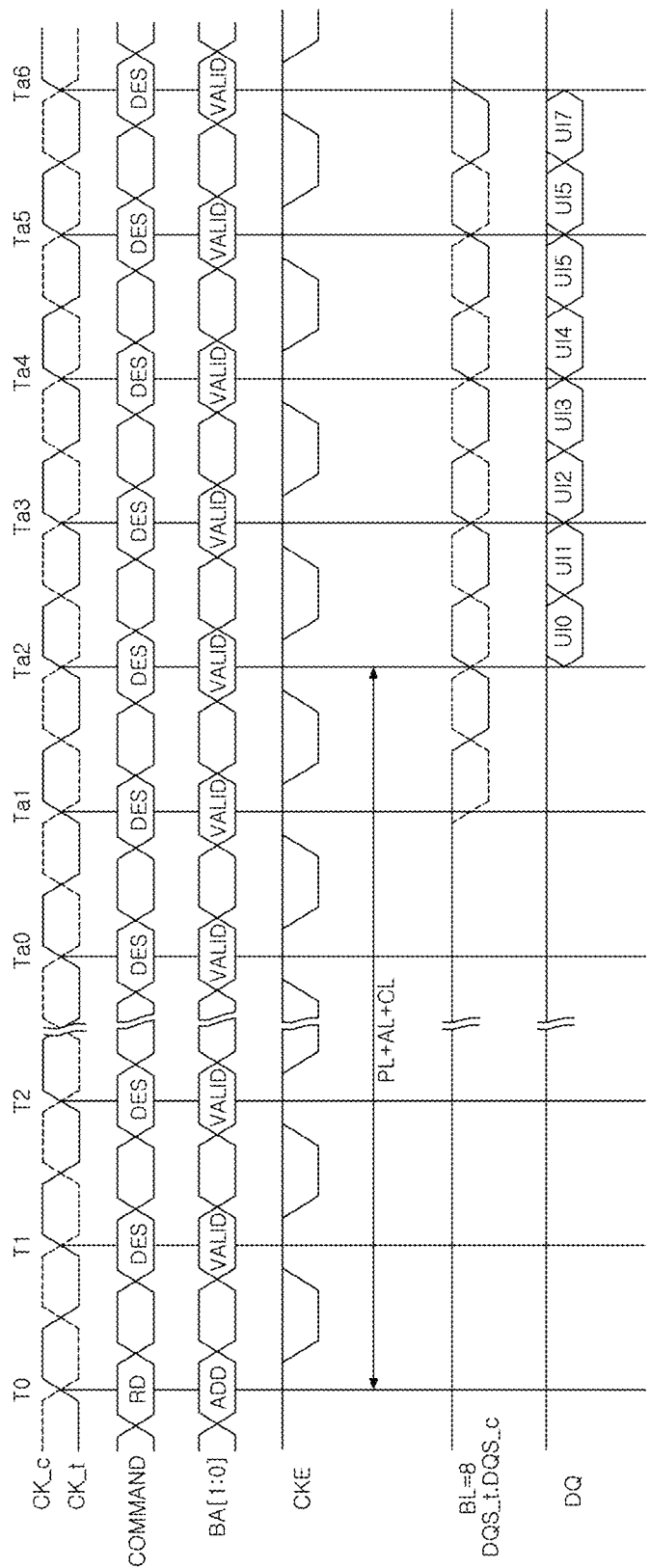
FIG. 3 is a timing diagram for explaining a read operation through the training unit illustrated in FIG. 1.

FIG. 3 is a timing diagram of a read operation performed by the training unit 20. When the training enable signal MPR_EN is enabled and the read command RD and the latch address signals BA[1:0] are received at the training unit 20, the test data a[0:7] is output to the input/output pad DQ[7:0] after a latency period. The latency period is substantially equal to the sum of a Parity Latency (PL), an Additive Latency (AL) and a CAS Latency (CL) that is set to be substantially equal to that of a read operation performed when the semiconductor memory apparatus 10 is operating in normal operation mode. A difference between when a read operation is performed in normal operation mode and a training read operation performed in testing operation mode is used to determine whether an active command is issued.

As mentioned above, the output control section 240 receives a serial output mode control signal M_Serial, a parallel output mode control signal M_Parallel and staggered output mode control signal M_Staggered as inputs and responsively generates the test data A[0:7] in accordance with the received output mode signals M_Serial, M_Parallel, and M_Staggered. The different output modes are serial output mode, parallel output mode and staggered output mode. FIG. 4 through FIG. 7 illustrate examples of the output of test data A[0:7] in different output modes.

FIG. 4 illustrates a data output form through the input/output pad DQ[7:0] in the case of a serial output mode, and FIG. 5 illustrates a data output form through the input/output pad DQ[7:0] in the case of a parallel output mode.

As illustrated in FIG. 4, in the case of the serial output mode, a single latch is selectively driven in a one-time test read operation. When BA[1:0] is 00, seventh to $0^{th}$ output test data MPR0[7:0] from a driven latch is sequentially output, wherein each input/output pad DQ[7:0] outputs substantially the same test data when each output operation is performed.

In the parallel output mode of FIG. 5, a single latch is selectively driven in a one-time test read operation. When BA[1:0] is 00, output test data MPR0[7:0] from a selectively driven latch is generally simultaneously output through each input/output pad DQ[7:0].

FIG. 6 and FIG. 7 illustrate data output forms in a staggered output mode.

In the staggered mode, when BA[1:0] is 00, all the latches MPR0, MPR1, MPR2, MPR3 constituting the latch section 230 are driven. Each latch substantially simultaneously outputs output test data MPRm[7:0] (m is a natural number including 0, which is substantially equal to or less than the number of the latches) to two different input/output pads, wherein seventh to $0^{th}$ output test data MPRm[7:0] is sequentially output through each input/output pad.

FIG. 9 illustrates a data output form in the staggered output mode illustrated in FIG. 6, which has been simplified according to a combination of the latch address signals BA[1:0].

A multi-purpose register may be used to support operations of the semiconductor memory apparatus 10 when the semiconductor memory apparatus 10 is placed in testing operation mode. The test data is stored in the multi-purpose register and is output in various modes, such as for example in, the serial, parallel, and staggered modes. The output control section 240 is configured to support the test data output in the various modes.

FIG. 8 is a diagram of an embodiment of an output control section 40 for a training unit 20 of a semiconductor memory apparatus 10.

A semiconductor memory apparatus 10 may include a training unit 20. For example, as illustrated in FIG. 2, the training unit 20 may include the decoding section 210, the latch driving control section 220, the latch section 230, the output control section 240, and the output driver 250. Alternative configuration of a training unit may be used. In an embodiment, the output control section 40 may be applied to a circuit apparatus using a multi-purpose register. A multi-purpose register may be configured to store test data and output test data. A multi-purpose register may be used to adjust a skew of an input/output operation.

The training unit 20 may include the output control section 40. Referring to FIG. 8, the output control section 40 may include a control signal generation part 410 and an output circuit 4100. The output circuit 4100 may include first, second, third and fourth output parts 420, 430, 440, 450.

The control signal generation part 410 generates a data output mode selection signal BTn in response to latch address signals BA[1:0] and a first data output mode signal. An example of a first data output mode signal is a staggered mode signal M_Staggered.

In an embodiment, the output circuit 4100 outputs one of a subset of the received output test data MPRm[7:0] or the entire received output test data MPRm[7:0] (m is a natural number including 0, which is substantially equal to or less than the number of latches) from each latch in response to a latch selection signal BAn (n is a natural number including 0, which is substantially equal to or less than the number of latches) generated from latch address signals BA[1:0], the data output mode selection signal BTn, and a second data output mode signal. An example of a second data output mode signal is a parallel mode signal M_Parallel. When a subset of the test data received from each latch is the output, the test data may be output sequentially or generally simultaneously according to the states of the second data output mode signal.

The output circuit 4100 may be configured to sequentially output either the whole or a subset of the test data received from each latch when the second data output mode signal is disabled. The output circuit 4100 may be configured to generally simultaneously output a subset of the test data received from each latch when the second data output mode signal is enabled.

A first output part 420 of the output circuit 4100 is configured to receive output test data from the plurality of latches and selects output test data from one latch from among the received test data MPRm[7:0] in response to the latch selection signal BAn generated from the latch address signals BA[1:0]. The first output part 420 generally simultaneously or sequentially outputs the selected output data MPRm[7:0] to a selected input/output pad in response to the second data output mode signal. An example of a second data output mode signal is a parallel mode signal M_Parallel. The first output part 420, for example, may output test data to a 0$^{th}$ and a fourth input/output pads (GIO_DQ0,4[7:0]).

The second output part 430, the third output part 440, and the fourth output part 450 are each configured to receive output test data from the plurality of latches and select output test data from one latch from among the received test data MPRm[7:0] in response to the data output mode selection signal BTn and generally simultaneously or sequentially outputs the selected output test data MPRm[7:0] to selected input/output pads in response to the second data output mode signal. An example of a second data output mode signal is a parallel mode signal M_Parallel. The second output part 430, for example, may output test data to first and fifth input/output pads GIO_DQ1,5[7:0]. The third output part 440, for example, may output test data to second and sixth input/output pads GIO_DQ2,6[7:0]. The fourth output part 450, for example, may output test data to third and seventh input/output pads GIO_DQ3,7[7:0].

FIG. 9 is a diagram illustrating the generation of the data output mode selection signal for an embodiment of the output control section.

When test data associated with MPR0[7:0] is output in the serial mode, the latch address signals BA[1:0] of 00, for example, are provided. In the staggered mode, the latch address signals BA[1:0] are changed to 01 in order to output the test data associated with MPR1[7:0] from the DQ [1,5]. The latch address signals BA[1:0] are changed to 10 in order to output the test data associated with MPR2[7:0] from the DQ [2,6], and the latch address signals BA[1:0] are changed to 11 in order to output the test data associated with MPR3 [7:0] from the DQ [3,7].

In the parallel mode and the serial mode, substantially the same test data values are output except for the difference of an output scheme (generally simultaneous output or sequential output). In the serial mode and the staggered mode, substantially the same test data is outputted only from the DQ [0,4].

It is possible to simplify the latch selection signal BAn to the data output mode selection signal BTn by combining the latch address signals BA[1:0] with the staggered mode signal M_Staggered. The control signal generation part as illustrated in FIG. 10 is configured based on the address conversion as illustrated in FIG. 9.

Figure 10A:
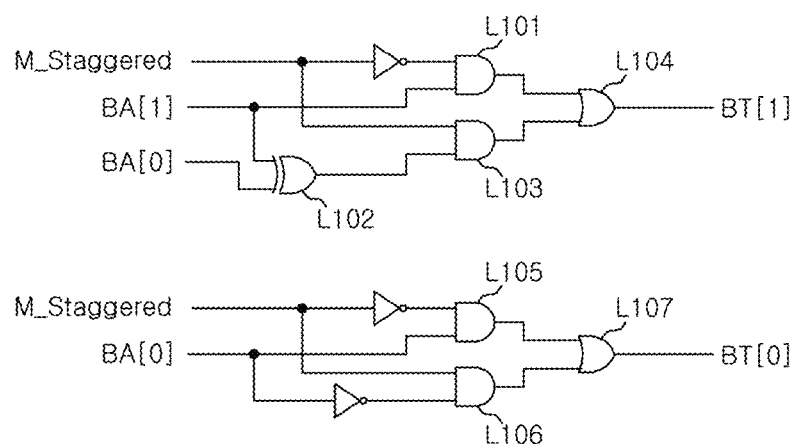
FIG. 10A to FIG. 10C are diagrams of examples of a control signal generation part illustrated in FIG. 8.
Figure 10B:
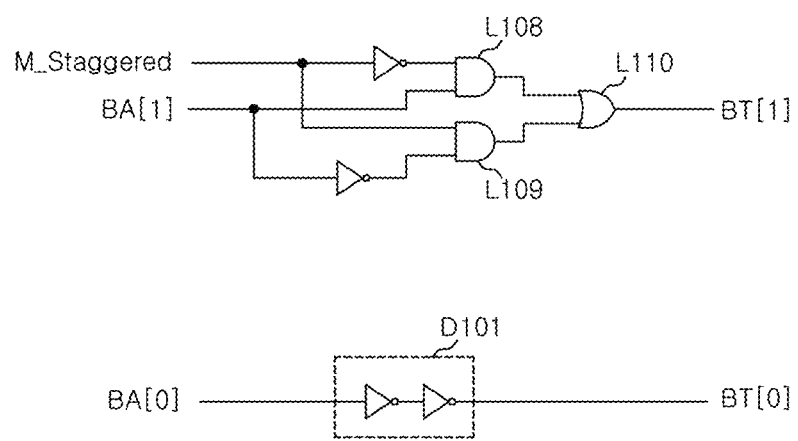
Figure 10C:
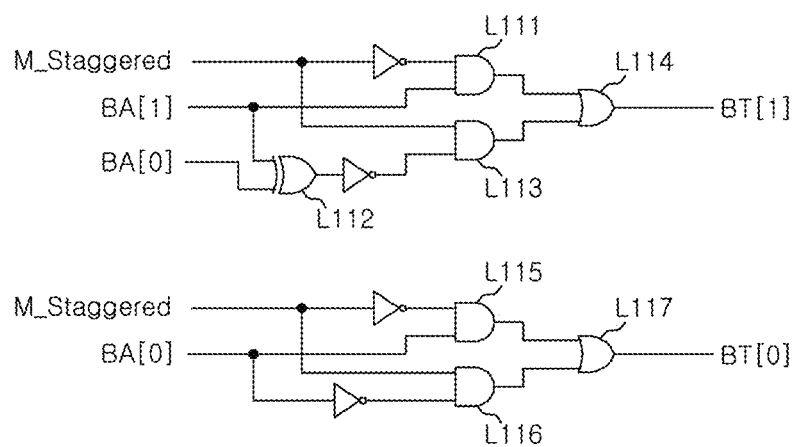

FIG. 10A to FIG. 10C are examples of diagrams of the control signal generation part 410 illustrated in FIG. 8.

FIG. 10A illustrates a first control signal generation part 410-1 for the test data GIO_DQ1,5[7:0] that is output through the first to the fifth input/output pads.

The first control signal generation part 410-1 may include first, second, third, fourth, fifth, sixth and seventh logic elements L101, L102, L103, L104, L105, L106, L107.

The first logic element L101 outputs a high level signal in response to an inversion signal of the first data output mode signal, for example, the staggered mode signal M_Staggered, and an upper bit BA[1] of the latch address signals BA[1:0] when the two input signals are all at a high level. The second logic element L102 outputs a high level signal in response to the upper bit BA[1] of the latch address signals BA[1:0] and a lower bit BA[0] of the latch address signals BA[1:0] when one of the two input signals is at a high level. The third logic element L103 outputs a high level signal when the staggered mode signal M_Staggered and an output signal of the second logic element L102 are all at a high level. The fourth element L104 outputs an upper bit BT[1] of the data output mode selection signal BT[1:0] to a high level when one of an output signal of the first logic element L101 and an output signal of the third logic element L103 is at a high level.

The fifth logic element L105 outputs a high level signal in response to the inversion signal of the staggered mode signal M_Staggered and the lower bit BA[0] of the latch address signals BA[1:0] when the two input signals are all at a high level. The sixth logic element L106 outputs a high level signal in response to the staggered mode signal M_Staggered and the inversion signal of the lower bit BA[0] of the latch address signals BA[1:0] when the two input signals are all at a high level. The seventh element L107 outputs a lower bit BT[0] of the data output mode selection signal BT[1:0] to a high level when one of an output signal of the fifth logic element L105 and an output signal of the sixth logic element L106 is at a high level.

FIG. 10B illustrates a second control signal generation part 410-2 for the test data GIO_DQ2,6[7:0] output through the second to the sixth input/output pads. The second control signal generation part 410-2, for example, may include eighth, ninth, tenth logic elements L108, L109, L110 and a delay element D101.

The eighth logic element L108 outputs a high level signal in response to the inversion signal of the first data output mode signal, for example, the staggered mode signal M_Staggered and the upper bit BA[1] of the latch address signals BA[1:0] when the two input signals are all at a high level. The ninth logic element L109 outputs a high level signal in response to the staggered mode signal M_Staggered and the inversion signal of the upper bit BA[1] of the latch address signals BA[1:0] when the two input signals are all at a high level. The tenth element L110 outputs the upper bit BT[1] of the data output mode selection signal BT[1:0] to a high level when one of an output signal of the eighth logic element L108 and an output signal of the ninth logic element L109 is at a high level.

The delay element D101 delays the lower bit BA[0] of the latch address signals BA[1:0] to an output time point of the upper bit BT[1] of the data output mode selection signal BT[1:0], and outputs the low bit BT[0] of the data output mode selection signal BT[1:0].

FIG. 10C illustrates a third control signal generation part 410-3 for the test data GIO_DQ3,7[7:0] that is output through the third to the seventh input/output pads. The third control signal generation part 410-3, for example, may include eleventh, twelfth, thirteenth, fourteenth, fifteenth, sixteenth, and seventeenth logic elements L111, L312, L113, L114, L115, L116, L117.

The eleventh logic element L111 outputs a high level signal in response to the inversion signal of the first data output mode signal, for example, the staggered mode signal M_Staggered, and the upper bit BA[1] of the latch address signals BA[1:0] when the two input signals are all at a high level. The twelfth logic element L112 outputs a high level signal in response to the upper bit BA[1] of the latch address signals BA[1:0] and the lower bit BA[0] of the latch address signals BA[1:0] when one of the two input signals is at a high level. The thirteenth logic element L113 outputs a high level signal when the staggered mode signal M_Staggered and an output signal of the twelfth logic element L112 are all at a high level. The fourteenth element L114 outputs the upper bit BT[1] of the data output mode selection signal BT[1:0] to a high level when one of an output signal of the eleventh logic element L111 and an output signal of the thirteenth logic element L113 is at a high level.

The fifteenth logic element L115 outputs a high level signal in response to the inversion signal of the staggered mode signal M_Staggered and the lower bit BA[0] of the latch address signals BA[1:0] when the two input signals are at a high level. The sixteenth logic element L116 outputs a high level signal in response to the staggered mode signal M_Staggered and the inversion signal of the lower bit BA[0] of the latch address signals BA[1:0] when the two input signals are at a high level. The seventeenth element L117 outputs the lower bit BT[0] of the data output mode selection signal BT[1:0] to a high level when one of an output signal of the fifteenth logic element L115 and an output signal of the sixteenth logic element L116 is at a high level.

As described above, the output parts 430, 440, and 450 for outputting the test data GIO_DQ1,5[7:0], GIO_DQ2,6[7:0], and GIO_DQ3,7[7:0], which is provided to the first and the fifth input/output pads, the second and the sixth input/output pads, and the third and the seventh input/output pads, can be controlled by the data output mode selection signal BTn other than the latch selection signal BAn.

FIG. 11A to FIG. 11D are diagrams of examples of the first, second, third and fourth output parts 420, 430, 440, 450 illustrated in FIG. 8.

The first, second, third and fourth output parts 420, 430, 440, 450 include multiplexers 501, 502, 503, 504 operating as first selection parts, respectively. The multiplexers 501, 502, 503, 504 select output test data from one latch among the output test data MPRm[7:0] received from each of the plurality of latches in response to the latch selection signal BAn generated from the latch address signals BA[1:0], or the data output mode selection signal BTn generated from the latch selection signal BAn, and output selection driving signals RMDQ04[7:0], RMDQ15[7:0], RMDQ26[7:0], and RMDQ37[7:0], respectively.

The first, second, third and fourth output parts 420, 430, 440, and 450 include multiplexers 511 and 512, 513 and 514, 515 and 516, and 517 and 518 operating as second selection parts, respectively. The multiplexers 511, 512, 513, 514, 515, 516, 517, 518 receive the selection driving signals RMDQ04[7:0], RMDQ15[7:0], RMDQ26[7:0], and RMDQ37[7:0] and selection signals RMDQ04[0], RMDQ04[4], RMDQ15[1], RMDQ15[5], RMDQ26[2], RMDQ26[6], RMDQ37[3], and RMDQ37[7] divided from the respective selection driving signals, and output the test data GIO_DQ0,4[7:0], GIO_DQ1,5[7:0], GIO_DQ2,6[7:0], and GIO_DQ3,7[7:0] to the respective input/output pad DQ[7:0] in response to the second data output mode signal. An example of the second data output mode signal is the parallel mode signal M_Parallel.

Figure 11A:
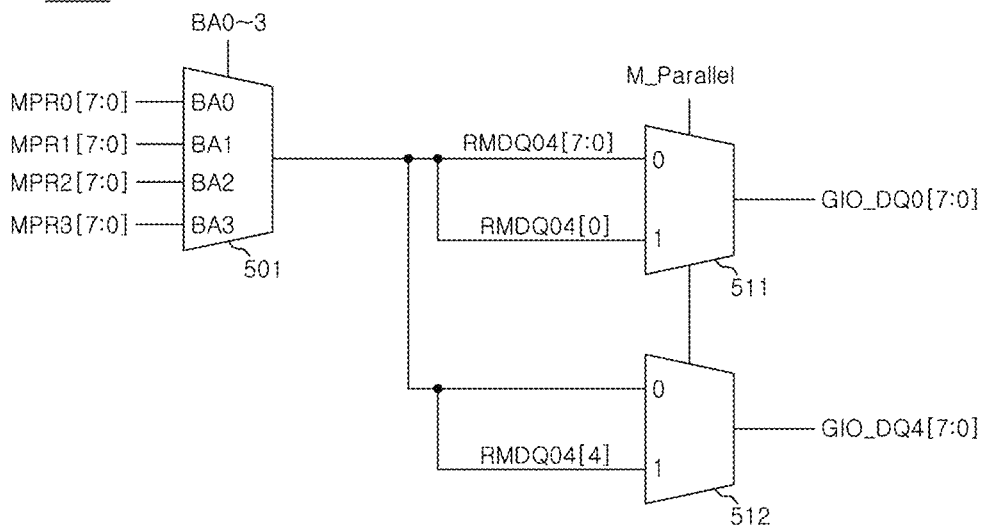
FIG. 11A to FIG. 11D are diagrams of examples of first to fourth output parts illustrated in FIG. 8.
Figure 11B:
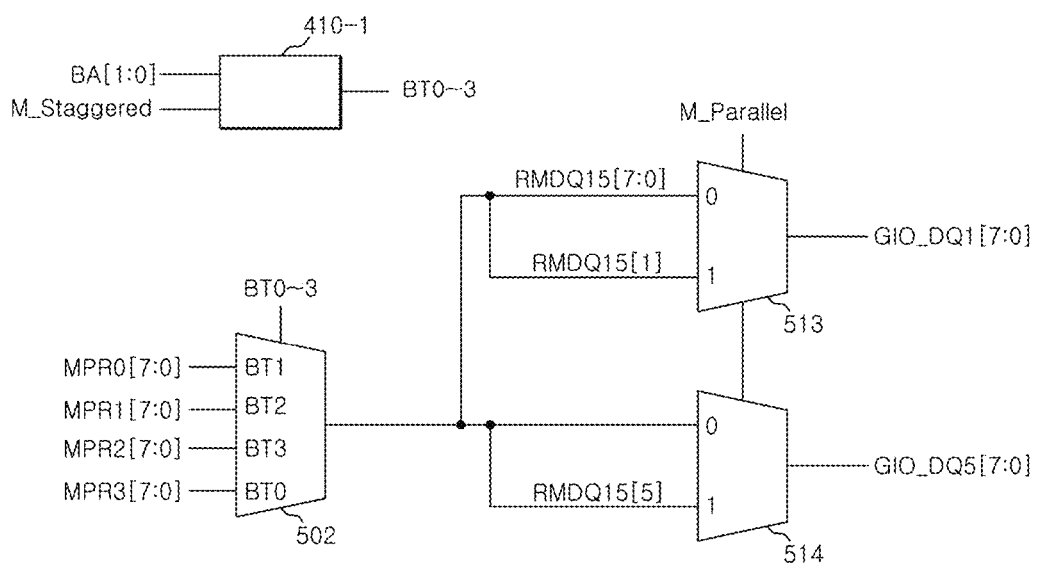
Figure 11C:
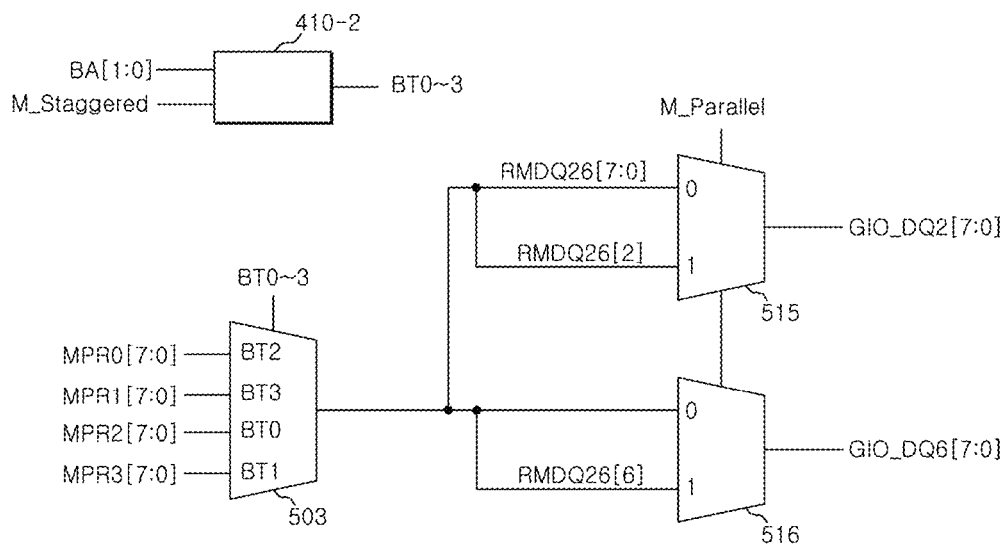
Figure 11D:
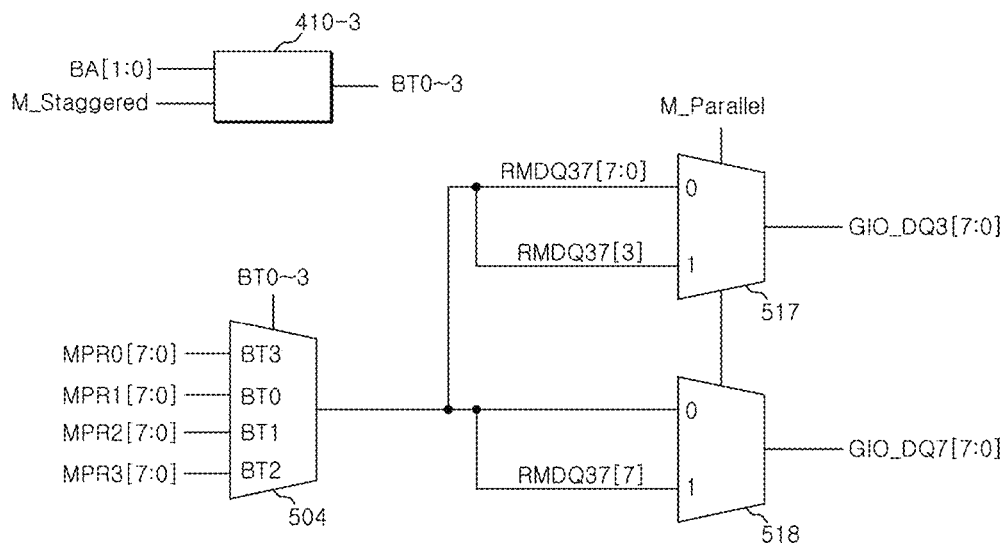
Figure 12:
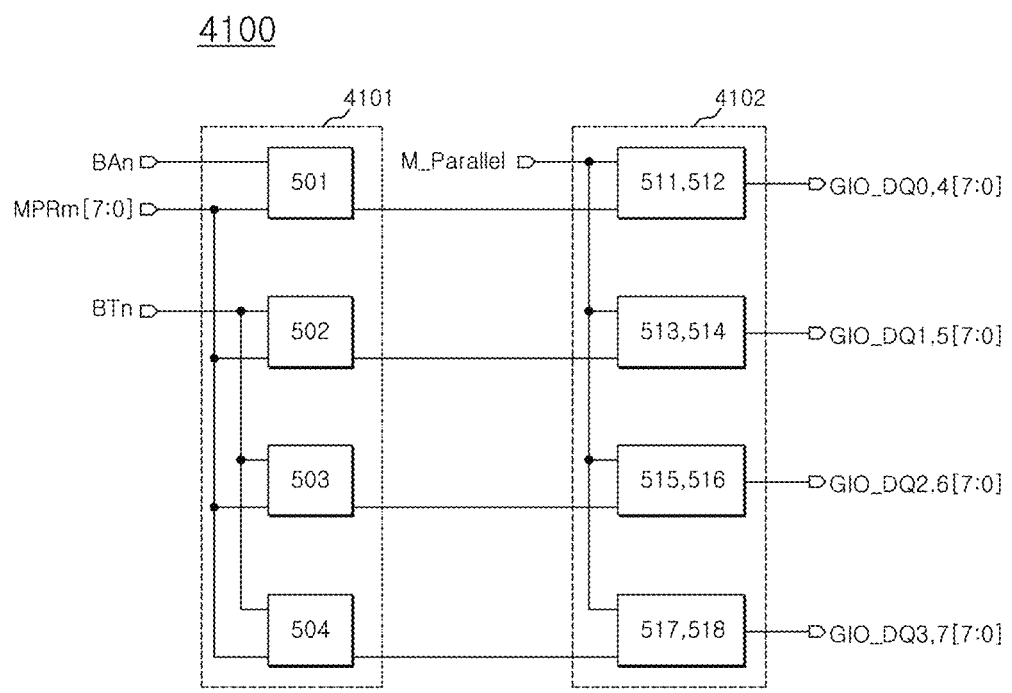
FIG. 12 is a diagram of an example of an output circuit illustrated in FIG. 8.

FIG. 12 is a configuration diagram when the output circuit 4100 illustrated in FIG. 8 is realized as illustrated in FIG. 11A through FIG. 11D.

The output circuit 4100 includes a first selection part 4101 and a second selection part 4102.

The first selection part 4101 may include multiplexers 501, 502, 503, and 504 that select output test data of one latch among the output test data MPRm[7:0] received from each of the plurality of latches in response to the latch selection signal BAn or the data output mode selection signal BTn generated from the latch selection signal BAn, and output the selection driving signals RMDQ04[7:0], RMDQ15[7:0], RMDQ26[7:0], and RMDQ37[7:0], respectively.

The second selection part 4102 may include multiplexers 511 and 512, 513 and 514, 515 and 516, and 517 and 518 that allocate output test data of the latch selected by the first selection part 4101 to the respective input/output pads DQ[7:0] in response to the second data output mode signal, and output the test data GIO_DQ0,4[7:0], GIO_DQ1,5[7:0], GIO_DQ2,6[7:0], and GIO_DQ3,7[7:0], respectively. The second data output mode signal is a parallel mode signal M_Parallel.

Referring to again FIG. 11A, the first output part 420 for outputting data to the $0^{th}$ and the fourth DQ pads includes the first, second, and third multiplexers 501, 511, 512.

The first multiplexer 501 operates as a selection part that selects the output test data (that is, a data group) of one latch among the output test data MPRm[7:0] from each latch of the plurality of latches in response to the latch selection signal BAn generated from the latch address signals BA[1:0], and outputs the first selection driving signal RMDQ04[7:0].

The second multiplexer 511 receives the first selection driving signal RMDQ04[7:0] output from the first multiplexer 501 and the $0^{th}$ selection signal RMDQ04[0] divided from the first selection driving signal RMDQ04[7:0], and outputs the test data GIO_DQ0[7:0] through the $0^{th}$ DQ pad in response to the second data output mode signal. An example of the second data output mode signal is the parallel mode signal M_Parallel. The data group selected by the second multiplexer 511 may be sequentially output from the $0^{th}$ DQ pad according to a data output strobe signal (the serial mode or the staggered mode), or one data of the selected data group may be repeatedly output from the $0^{th}$ DQ pad (the parallel mode).

The third multiplexer 512 receives the first selection driving signal RMDQ04[7:0] output from the first multiplexer 501 and the fourth selection signal RMDQ04[4] divided from the first selection driving signal RMDQ04[7:0], and outputs the test data GIO_DQ4[7:0] through the fourth DQ pad in response to the second data output mode signal. An example of the second data output mode signal is the parallel mode signal M_Parallel. The data group selected by the third multiplexer 512 may be sequentially output from the fourth DQ pad according to the data output strobe signal (the serial mode or the staggered mode), or one data of the selected data group may be repeatedly output from the fourth DQ pad (the parallel mode).

The second output part 430 illustrated in FIG. 11B may include the fourth, fifth, and sixth multiplexers 502, 513, 514.

The data output mode selection signal BTn used in the second output part 430, for example, may include a signal generated by the first control signal generation part of FIG. 10A.

The fourth multiplexer 502 operates as a selection part that selects the output (that is, a data group) of one latch among the output test data MPRm[7:0] received from each of the plurality of latches in response to the data output mode selection signal BTn generated by the first control signal generation part 410-1, and outputs the second selection driving signal RMDQ15[7:0].

The fifth multiplexer 513 receives the second selection driving signal RMDQ15[7:0] and the first selection signal RMDQ15[1] divided from the second selection driving signal RMDQ15[7:0], and outputs the test data GIO_DQ1 [7:0] through the first DQ pad in response to the second data output mode signal. An example of the second data output mode signal is the parallel mode signal M_Parallel.

The sixth multiplexer 514 receives the second selection driving signal RMDQ15[7:0] and the fifth selection signal RMDQ15[5] divided from the second selection driving signal RMDQ15[7:0], and outputs the test data GIO_DQ5[7:0] through the fifth DQ pad in response to the second data output mode signal. An example of the second data output mode signal is the parallel mode signal M_Parallel.

The test data GIO_DQ1,5[7:0], output from the fifth and the sixth multiplexers 513, 514 may be sequentially or repeatedly output through the respective input/output pads.

The operations of the third output part 440 illustrated in FIG. 11C and the fourth output part 450 illustrated in FIG. 11D are substantially similar to that of the second output part 430 illustrated in FIG. 11B.

As illustrated in FIG. 11A to FIG. 11D, the output circuit 4100 (420, 430, 440, and 450) of the output control section 40 can be configured by four 4:1 multiplexers 501, 502, 503, 504 and eight 2:1 511, 512, 513, 514, 515, 516, 517, 518.

Figure 13:
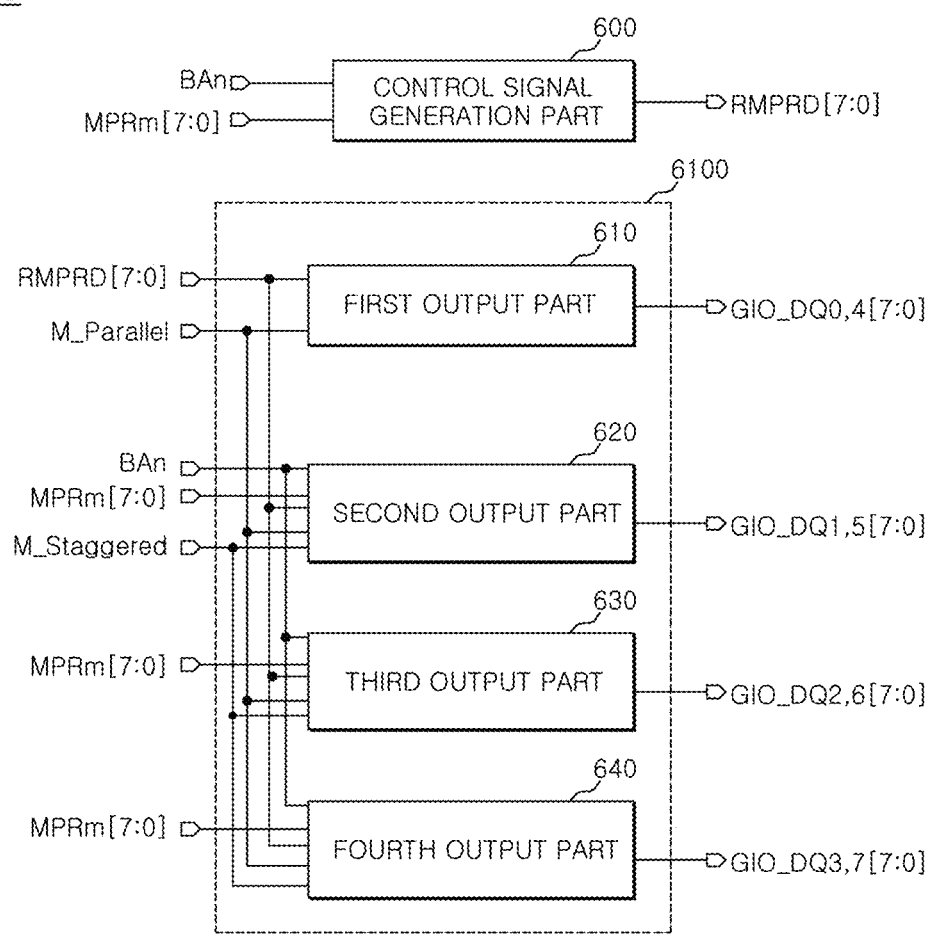
FIG. 13 is a diagram of an embodiment of an output control section for a training unit applied to a semiconductor apparatus.

FIG. 13 is a diagram of an example of an embodiment of the output control section 60 for the training unit 20 applied to the semiconductor apparatus 10.

An output control section 60 illustrated in FIG. 13 may include a control signal generation part 600 and an output circuit 6100. The output circuit 6100 may include first, second, third and fourth output parts 610, 620, 630, 640.

The control signal generation part 600 selects the test data output (that is, a data group) of one latch among the output test data MPRm[7:0] received from each latch of the plurality of latches in response to the latch selection signal BAn generated from the latch address signals BA[1:0], and outputs common mode signals RMPRD[7:0].

The output circuit 6100 outputs the whole or a subset of the output test data MPRm[7:0] from each latch of the plurality of latches in response to the latch selection signal BAn, the output test data MPRm[7:0] from each latch, the first data output mode signal (for example, the staggered mode signal M_Staggered), and the second data output mode signal (for example, the parallel mode signal M_Parallel).

The output circuit 6100 may sequentially output the whole of the test data, which is output from each latch, when the first data output mode signal is enabled and the second data output mode signal is disabled. The output circuit 6100 may sequentially a output a subset of the test data, which is received from each latch, when the first data output mode signal and the second data output mode signal are disabled. The output circuit 6100 may generally simultaneously output a subset of the test data output from each latch, when the first data output mode signal is disabled and the second data output mode signal is enabled.

A first output part 610 of the output circuit 6100 receives the common mode signals RMPRD[7:0], and outputs the selected output test data MPRm[7:0] to selected input/output pads, for example, the $0^{th}$ and the fourth input/output pads, in response to the second data output mode signal (GIO_DQ0, 4[7:0]). The second data output mode signal is a parallel mode signal M_Parallel.

The second, third and fourth output parts 620, 630, 640 receive the output test data MPRm[7:0] from each of the plurality of latches, and select the output of one latch in response to the latch selection signal BAn. The second, third, fourth output parts 620, 630, 640 select one of the output test data of the selected test data and the common mode signals RMPRD[7:0] in response to the first data output mode signal. The first data output mode signal is a staggered mode signal M_Staggered. A data group selected by the common mode signals RMPRD[7:0] is output to selected input/output pads in response to the second data output mode signal. The second data output mode signal is a parallel mode signal M_Parallel. The test data GIO_DQ1,5[7:0] from the second output part 620, for example, may be output to the first and the fifth input/output pads, the test data GIO_DQ2,6[7:0] from the third output part 630, for example, may be output to the second and the sixth input/output pads, and the test data GIO_DQ3,7[7:0] from the fourth output part 640, for example, may be output to the third and the seventh input/output pads.

FIG. 14A to FIG. 14D are diagrams of examples of the control signal generation part and the first, second, third and fourth output parts illustrated in FIG. 13.

Figure 14A:
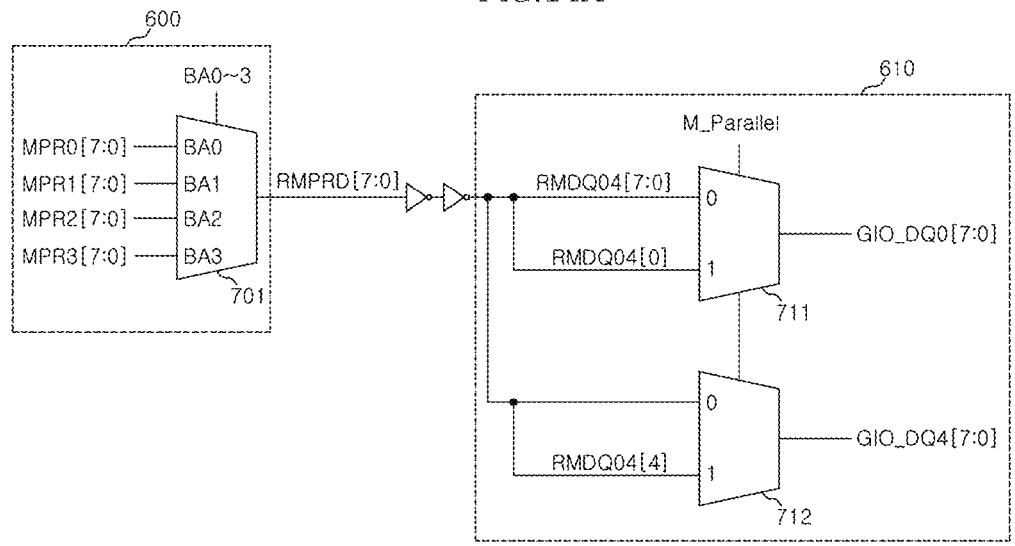
FIG. 14A to FIG. 14D are diagrams of examples of a control signal generation part and first to fourth output parts illustrated in FIG. 13.

FIG. 14A illustrates an example of the control signal generation part 600 and the first output part 610.

The control signal generation part 600 may include a first multiplexer 701 operating as a selection part, which receives the output data MPRm[7:0] from each of the plurality of latches, selects one of the output test data MPRm[7:0] received from each of the latches in response to the latch selection signal BAn and outputs the common mode signals RMPRD[7:0].

The first output part 610 may include a second multiplexer 711 and a third multiplexer 712. The second multiplexer 711 receives the first selection driving signal RMDQ04[7:0] generated from the common mode signals RMPRD[7:0] and the $0^{th}$ selection signal RMDQ04[0] divided from the first selection driving signal RMDQ04[7:0], and outputs the test data GIO_DQ0[7:0] through the $0^{th}$ DQ pad in response to the second data output mode signal. An example of the second data output mode signal is the parallel mode signal M_Parallel. The third multiplexer 712 receives the first selection driving signal RMDQ04[7:0] generated from the common mode signals RMPRD[7:0] and the fourth selection signal RMDQ04[4] divided from the first selection driving signal RMDQ04[7:0] and outputs the test data GIO_DQ4[7:0] through the fourth DQ pad in response to the second data output mode signal. An example of the second data output mode signal is a parallel mode signal M_Parallel.

Data groups selected by the second the third multiplexers 711, 712 may be sequentially output from the $0^{th}$ and the fourth DQ pads according to the data output strobe signal (the serial mode or the staggered mode), or one data of the selected data groups may be repeatedly output from the $0^{th}$ DQ pad (the parallel mode).

Figure 14B:
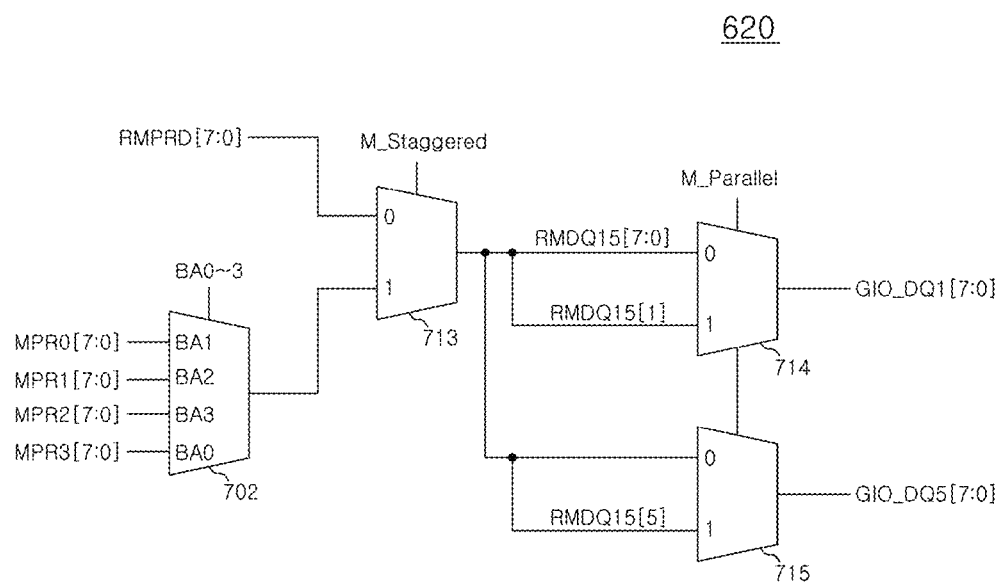

The second output part 620 may include fourth, fifth, sixth and seventh multiplexers 702, 713, 714, 715 as illustrated in FIG. 14B.

The fourth multiplexer 702 receives the output test data MPRm[7:0] from each of the plurality of latches, and selects the output test data from one of the plurality of latches in response to the latch selection signal BAn.

The fifth multiplexer 713 receives the common mode signals RMPRD[7:0] and an output signal from the fourth multiplexer 702, selects one of the input signals in response to the staggered mode signal M_Staggered, and outputs the second selection driving signal RMDQ15[7:0].

The sixth multiplexer 714 receives the second selection driving signal RMDQ15[7:0] and the first selection signal RMDQ15[1] divided from the second selection driving signal RMDQ15[7:0], and outputs the test data GIO_DQ1[7:0] through the first DQ pad in response to the parallel mode signal M_Parallel.

The seventh multiplexer 715 receives the second selection driving signal RMDQ15[7:0] and the fifth selection signal RMDQ15[5] divided from the second selection driving signal RMDQ15[7:0], and outputs the test data GIO_DQ5[7:0] through the fifth DQ pad in response to the parallel mode signal M_Parallel.

Figure 14C:
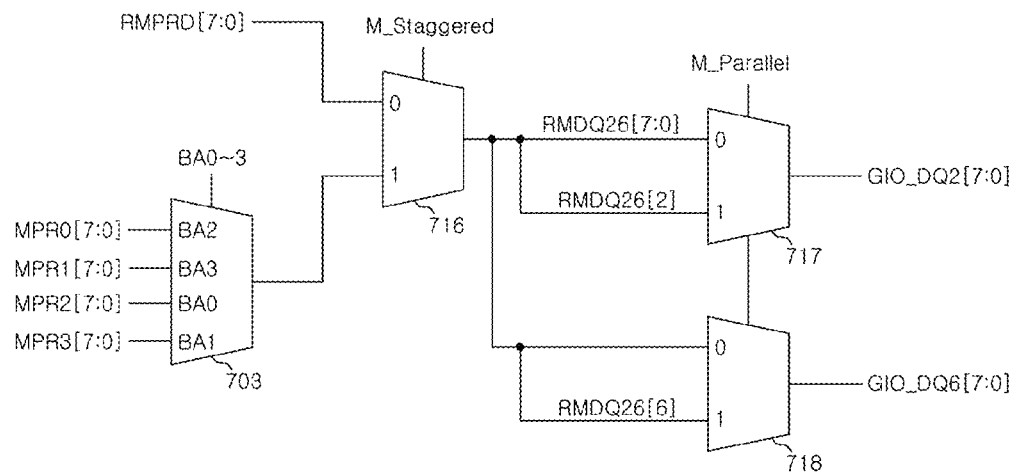

The third output part 630 illustrated in FIG. 14C, for example, may include eighth, ninth, tenth and eleventh multiplexers 703, 716, 717, 718.

The eighth multiplexer 703 receives the output test data MPRm[7:0] from each of the plurality of latches, and selects output test data from one of the plurality latches in response to the latch selection signal BAn.

The ninth multiplexer 716 receives the common mode signals RMPRD[7:0] and an output signal of the eighth multiplexer 703, selects one of the input signals in response to the staggered mode signal M_Staggered, and outputs the third selection driving signal RMDQ26[7:0].

The tenth multiplexer 717 receives the third selection driving signal RMDQ26[7:0] and the second selection signal RMDQ26[2] divided from the third selection driving signal RMDQ26[7:0], and outputs the test data GIO_DQ2[7:0] through the second DQ pad in response to the parallel mode signal M_Parallel.

The eleventh multiplexer 718 receives the third selection driving signal RMDQ26[7:0] and the sixth selection signal RMDQ26[6] divided from the third selection driving signal RMDQ26[7:0], and outputs the test data GIO_DQ6[7:0] through the sixth DQ pad in response to the parallel mode signal M_Parallel.

Figure 14D:
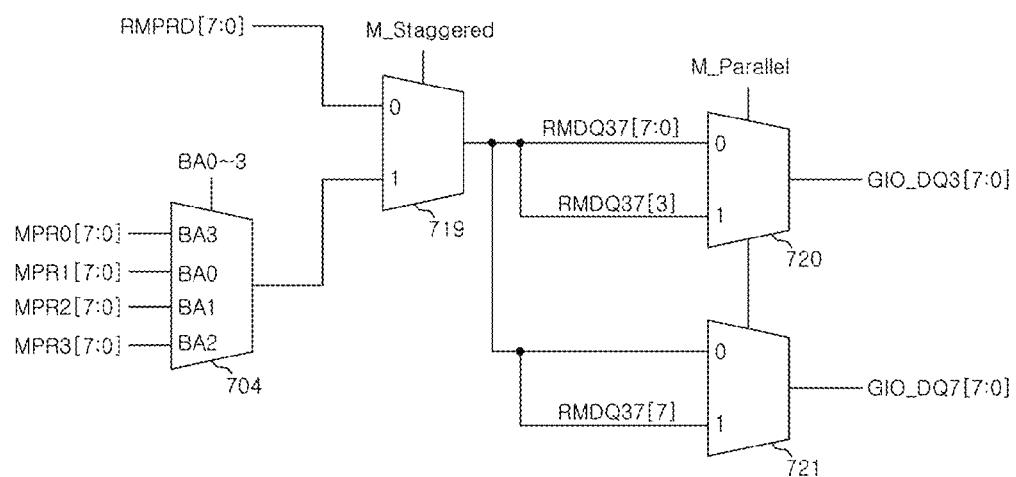

The fourth output part 640 illustrated in FIG. 14D, for example, may include twelfth, thirteenth, fourteenth and fifteenth multiplexers 704, 719, 720, 721.

The twelfth multiplexer 704 receives the output data MPRm[7:0] from each of the plurality of latches, and selects the output test data from one of the plurality of latches in response to the latch selection signal BAn.

The thirteenth multiplexer 719 receives the common mode signals RMPRD[7:0] and an output signal of the twelfth multiplexer 704, selects one of the input signals in response to the staggered mode signal M_Staggered, and outputs the fourth selection driving signal RMDQ37[7:0].

The fourteenth multiplexer 720 receives the fourth selection driving signal RMDQ37[7:0] and the third selection signal RMDQ37[3] divided from the fourth selection driving signal RMDQ37[7:0], and outputs the test data GIO_DQ3[7:0] through the third DQ pad in response to the parallel mode signal M_Parallel.

The fifteenth multiplexer 721 receives the fourth selection driving signal RMDQ37[7:0] and the seventh selection signal RMDQ37[7] divided from the fourth selection driving signal RMDQ37[7:0], and outputs the test data GIO_DQ7[7:0] through the seventh DQ pad in response to the parallel mode signal M_Parallel.

Figure 15:
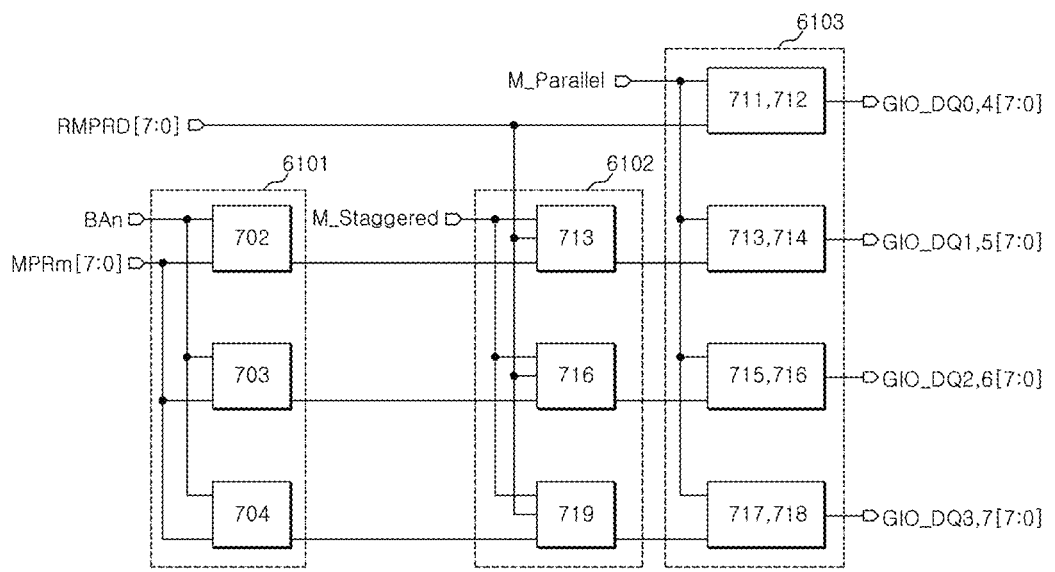
FIG. 15 is a diagram of an example of an output circuit illustrated in FIG. 13.

FIG. 15 is a configuration diagram when the output circuit 6100 illustrated in FIG. 13 is realized as illustrated in FIG. 14A to FIG. 14D.

The output circuit 6100 includes a first selection part 6101, a second selection part 6102, and a third selection part 6103.

The first selection part 6101 may include multiplexers 702, 703, 704 configured to select the output of one latch among the output test data MPRm[7:0] from each of the plurality of latches in response to the latch selection signal BAn, respectively.

The second selection part 6102 may include multiplexers 713, 716, 719 that select one of the common mode signals RMPRD[7:0] output from the control signal generation part 600 and an output signal of the first selection part 6101 in response to the staggered mode signal M_Staggered. The staggered mode signal M_Staggered is the first data output mode signal.

The third selection part 6103 include multiplexers 711 and 712, 713 and 714, 715 and 716, and 717 and 718 that allocate output test data of the latches selected by the second selection part 6102 to the respective input/output pads DQ[7:0] in response to the parallel mode signal M_Parallel, where the parallel mode signal M_Parallel is the second data output mode signal, and output the test data GIO_DQ0,4[7:0], GIO_DQ1,5[7:0], GIO_DQ2,6[7:0], and GIO_DQ3,7[7:0], respectively.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
a latch section including a plurality of latches configured to store test data;
a control signal generation part configured to generate a data output mode selection signal in response to a latch address signal and a first data output mode signal; and
an output circuit configured to operate in accordance with a training enable signal and generate at least a subset of test data output by each of the plurality of latches in response to a latch selection signal, the data output mode selection signal, and a second data output mode signal.

2. The semiconductor memory apparatus according to claim 1, wherein the output circuit is configured to sequentially generate the at least subset of test data output by each of the plurality of latches when the received the second data output mode signal is disabled.

3. The semiconductor memory apparatus according to claim 1, wherein the output circuit is configured to substantially simultaneously generate the at least subset of test data output by each of the plurality of latches when the received second data output mode signal is enabled.

4. The semiconductor memory apparatus according to claim 1, wherein the received first data output mode signal is a staggered mode signal.

5. The semiconductor memory apparatus according to claim 4, wherein the received second data output mode signal is a parallel mode signal.

6. The semiconductor memory apparatus according to claim 1, wherein the latch selection signal is embedded within the latch address signal.

7. The semiconductor memory apparatus according to claim 1, wherein the output circuit comprises:
a first selection part is configured to received test output data from the plurality of latches, to select output test data received from one of the plurality of latches in response to one of the latch selection signal and the data output mode selection signal, and to responsively output a selection driving signal; and a second selection part configured to receive the selection driving signal, and to one of sequentially and substantially simultaneously output the selected output test data to an input/output pad associated with the one of the plurality of latches in response to the second data output mode signal.

8. The semiconductor memory apparatus according to claim 1, wherein the output circuit comprises:

a first output part configured to receive test output data from the plurality of latches, and to select output test data received from one of the plurality of latches in response to the latch selection signal, and to one of sequentially and substantially simultaneously output the selected output test data to a pair of selected input/output pads in response to the second data output mode signal; and second, third and fourth output parts each configured to receive test output data from the plurality of latches, and to select output test data received from of the plurality of latches in response to the data output mode selection signal, and to one of sequentially and simultaneously output the selected output test data to a pair of associated selected input/output pads in response to the second data output mode signal.

9. The semiconductor memory apparatus according to claim 8, wherein the first output part is configured to output test data to $0^{th}$ and fourth input/output pads, the second output part is configured to output test data to first and fifth input/output pads, the third output part configured to output test data to second and sixth input/output pads, and the fourth output part configured to output test data to third and seventh input/output pads.

10. A semiconductor memory apparatus comprising:

a latch section including a plurality of latches configured to store test data;

a control signal generation part configured to select output test data of one latch from among the plurality of latches in response to a latch selection signal and to output the selected output test data as a common mode signal; and an output circuit configured to output at least a subset of the test data received from each of the plurality of latches in response to the latch selection signal, the output data from each of the plurality of latches, a first data output mode signal, and a second data output mode signal.

11. The semiconductor memory apparatus according to claim 10, wherein the test data received from each of the plurality of latches is sequentially outputted when the received first data output mode signal is enabled and when the second data output mode signal is disabled.

12. The semiconductor memory apparatus according to claim 10, wherein the test data output from each of the plurality of latches is sequentially output when the first data output mode signal and the second data output mode signal are disabled.

13. The semiconductor memory apparatus according to claim 10, wherein the test data output from each of the plurality of latches is substantially simultaneously output when the first data output mode signal is disabled and the second data output mode signal is enabled.

14. The semiconductor memory apparatus according to claim 10, wherein the first data output mode signal comprises a staggered mode signal.

15. The semiconductor memory apparatus according to claim 14, wherein the second data output mode signal comprises a parallel mode signal.

16. The semiconductor memory apparatus according to claim 10, wherein the latch selection signal is generated by the latch address signal.

17. The semiconductor memory apparatus according to claim 10, wherein the output circuit comprises:

a first selection part configured to select output test data of one latch from among the output test data stored in the plurality of latches in response to the latch selection signal;

a second selection part configured to select one of the common mode signal and an output signal of the first selection part in response to the first data output mode signal; and a third selection part configured to one of sequentially and substantially simultaneously output test data selected by the second selection part to a corresponding input/output pad in response to the second data output mode signal.

18. The semiconductor memory apparatus according to claim 10, wherein the output circuit comprises:

a first output part configured to that receive the common mode signal and to one of sequentially and substantially simultaneously output test data based on the common mode signal to a pair of selected input/output pads in response to the second data output mode signal; and second, third and fourth output parts configured to receive the output test data from each of the plurality of latches, to select output test data of one latch in response to the latch selection signal, to select one of output data of a selected latch and the common mode signal in response to the first data output mode signal, and to one of sequentially and substantially simultaneously output the selected test data to an associated pair of selected input/output pads in response to the second data output mode signal.

19. The semiconductor memory apparatus according to claim 18, wherein the first output part is configured to output test data to $0^{th}$ and fourth input/output pads, the second output part is configured to output test data to first and fifth input/output pads, the third output part is configured to output test data to second and sixth input/output pads, and the fourth output part configured to output test data to third and seventh input/output pads.

* * * * *